United States Patent
Shim

(10) Patent No.: US 10,691,016 B2
(45) Date of Patent: Jun. 23, 2020

(54) METHODS OF FORMING SEMICONDUCTORS USING ETCHING EFFECT PREDICTIONS AND METHODS FOR DETERMINING INPUT PARAMETERS FOR SEMICONDUCTOR FORMATION

(71) Applicant: Samsung Electronics Co., Ltd., Suwon-si, Gyeonggi-do (KR)

(72) Inventor: Seong Bo Shim, Yongin-si (KR)

(73) Assignee: Samsung Electronincs Co., Ltd. (KR)

( * ) Notice: Subject to any disclaimer, the term of this patent is extended or adjusted under 35 U.S.C. 154(b) by 89 days.

(21) Appl. No.: 15/955,975

(22) Filed: Apr. 18, 2018

(65) Prior Publication Data

US 2019/0129297 A1 May 2, 2019

(30) Foreign Application Priority Data

Oct. 31, 2017 (KR) .......................... 10-2017-0143484

(51) Int. Cl.
*G06F 30/31* (2020.01)
*G03F 1/36* (2012.01)
(Continued)

(52) U.S. Cl.
CPC ................. *G03F 1/36* (2013.01); *G03F 1/44* (2013.01); *G03F 1/80* (2013.01); *G03F 7/705* (2013.01);
(Continued)

(58) Field of Classification Search
CPC .... B41J 2/04573; H04N 19/63; G06F 21/554; G06F 21/57; G06F 21/575; G06F 21/64; G06F 21/71; G06F 21/73; G06F 21/74; G06F 21/78; G06F 19/321; G06F 11/2094; G06F 11/30; G06F 11/3006;
(Continued)

(56) References Cited

U.S. PATENT DOCUMENTS 5,467,883 A 11/1995 Frye et al.
6,578,188 B1 * 6/2003 Pang .................... G03F 1/26
716/52

(Continued)

FOREIGN PATENT DOCUMENTS

JP 10-306387 11/1998
JP 2009246368 10/2009
(Continued)

OTHER PUBLICATIONS

Japanese Office Action dated Oct. 29, 2019, issued in corresponding Japanese Patent Application No. 2018-142618 (5 pages).

*Primary Examiner* — Binh C Tat
(74) *Attorney, Agent, or Firm* — Myers Bigel, P.A.

(57) ABSTRACT

An etching effect prediction method includes determining a sample area of a mask pattern in which etch bias is to be predicted, determining input parameters indicating physical characteristics affecting an etching process undertaken in the sample area, comparing an output value obtained by inputting the input parameters to an artificial neural network, to a measured value of the etch bias that occurred in the sample area, and operating the artificial neural network until a difference between the output value and the measured value is equal to or less than a predetermined reference value.

20 Claims, 13 Drawing Sheets

(51) Int. Cl.
*H01L 21/311* (2006.01)
*G03F 7/20* (2006.01)
*G06F 17/00* (2019.01)
*G03F 1/44* (2012.01)
*G03F 1/80* (2012.01)
*G05B 13/02* (2006.01)

(52) U.S. Cl.
CPC ....... *G03F 7/70625* (2013.01); *G05B 13/027* (2013.01); *G06F 17/00* (2013.01); *H01L 21/31144* (2013.01)

(58) Field of Classification Search
CPC ............. G06F 11/3027; G06F 11/3051; G06F 16/1744; G06F 16/21; G06F 16/51; G06F 17/00; G06F 21/445; G06F 21/6245; Y10S 707/968; Y10S 707/972; B01L 3/502761; G06K 9/00; G06K 9/00288; G06K 9/6282; G06K 9/74; A61B 5/7203
USPC ..................................................... 716/50–56
See application file for complete search history.

(56) References Cited

U.S. PATENT DOCUMENTS

| | | |
|---|---|---|
| 6,700,648 B2 | 3/2004 | Jun et al. |
| 7,438,996 B2 | 10/2008 | Ozawa |
| 7,473,495 B2 | 1/2009 | Tanaka et al. |
| 7,735,053 B2 | 6/2010 | Harazaki |
| 7,966,580 B2 | 6/2011 | Maeda |
| 8,429,571 B2 | 4/2013 | Kim |
| 8,464,194 B1 | 6/2013 | Agarwal et al. |
| 8,762,901 B2 | 6/2014 | Lee et al. |
| 9,620,338 B2 | 4/2017 | Samukawa et al. |
| 2005/0199341 A1 | 9/2005 | Delp et al. |
| 2006/0161452 A1* | 7/2006 | Hess .................. G03F 1/36 716/55 |
| 2007/0100591 A1 | 5/2007 | Harazaki |
| 2007/0249071 A1 | 10/2007 | Lian et al. |
| 2008/0134131 A1 | 6/2008 | Asano et al. |
| 2009/0087757 A1 | 4/2009 | Onoue |
| 2009/0242513 A1 | 10/2009 | Funk et al. |
| 2010/0251202 A1* | 9/2010 | Pierrat .................. G03F 1/36 716/50 |
| 2011/0224945 A1 | 9/2011 | Shim et al. |
| 2011/0299758 A1 | 12/2011 | Shi et al. |
| 2012/0185813 A1 | 7/2012 | Kaushal et al. |
| 2016/0148850 A1 | 5/2016 | David |

FOREIGN PATENT DOCUMENTS

| | | |
|---|---|---|
| JP | 4900013 | 1/2012 |
| JP | 5356089 | 9/2013 |
| JP | 2013541038 | 11/2013 |
| JP | 2014507801 | 3/2014 |
| WO | 2017062728 | 4/2017 |

* cited by examiner $x_i = \{0.5, 0, 0.5, 0.5, 0, 0.5, 0, 0.25, 0, 0.2, 0.2\}$

METHODS OF FORMING SEMICONDUCTORS USING ETCHING EFFECT PREDICTIONS AND METHODS FOR DETERMINING INPUT PARAMETERS FOR SEMICONDUCTOR FORMATION

CROSS-REFERENCE TO RELATED APPLICATION

This U.S. nonprovisional patent application claims priority under 35 U.S.C § 119 to Korean Patent Application No. 10-2017-0143484 filed on Oct. 31, 2017 in the Korean Intellectual Property Office, the entire contents of which are incorporated herein by reference.

BACKGROUND

1. Field

The present inventive concepts relate to the use of etching effect prediction methods in semiconductor formation and input parameter determination methods that may be used to support semiconductor formation.

2. Description of Related Art

To support an etching process within a semiconductor formation process, a mask may be formed above an etching target. In recent years, as the degree of integration of semiconductor devices has increased, the degree of accuracy used in forming the etching mask has become increasingly important. However, when a mask pattern is formed to have a desired shape and an etching process is undertaken, an error between a mask pattern and a semiconductor pattern formed by an etching process may occur. The error may affect the operation of the semiconductor device, resulting in reduced performance and/or failure of the semiconductor device

SUMMARY

Aspects of the present inventive concepts may provide etching effect prediction methods and input parameter determination methods that are capable of accurately predicting an error between a mask pattern used in an etching process and a semiconductor pattern formed in an etching process.

According to an aspect of the present inventive concepts, an etching effect prediction method includes: determining a sample area of a mask pattern for which etch bias is to be predicted; determining input parameters indicating physical characteristics affecting an etching process undertaken in the sample area; comparing an output value obtained by inputting the input parameters to an artificial neural network, to a measured value of the etch bias that occurred in the sample area; and operating the artificial neural network to until a difference between the output value and the measured value is equal to or less than a predetermined reference value.

According to an aspect of the present inventive concepts, an input parameter determination method for an artificial neural network includes: determining first input parameters corresponding to an amount of etching particles in contact with each of a plurality of sample areas of a mask pattern for an etching process of a wafer; determining second input parameters corresponding to a shape of the mask pattern adjacent to each of the plurality of sample areas; and providing the first and second input parameters to the artificial neural network.

According to an aspect of the present inventive concepts, an etching effect prediction method includes: forming a mask pattern on a layer on which an etching process is to be undertaken; selecting a target area in which etch bias occurring in the etching process is to be predicted; determining input parameters indicating physical characteristics affecting the etching process undertaken in the target area; and predicting the etch bias of the target area by inputting the input parameters to input nodes of an artificial neural network in which learning is completed as an etching effect prediction model.

BRIEF DESCRIPTION OF DRAWINGS

The above and other aspects, features and other advantages of the present inventive concepts will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
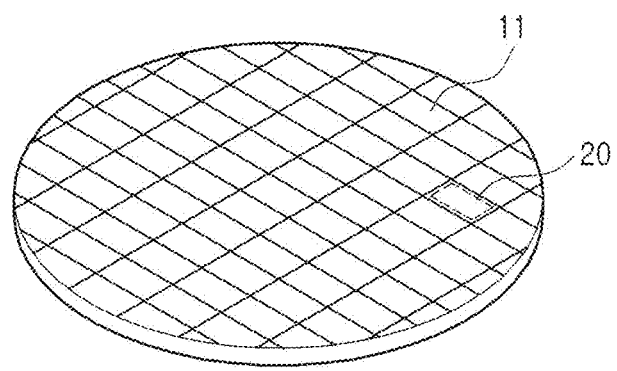
FIG. 1 is a schematic drawing illustrating a semiconductor wafer to which an etching process according to an example embodiment of the present inventive concepts may be applied.

FIG. 1 is a schematic drawing illustrating a semiconductor wafer 10 to which an etching process according to an example embodiment of the present inventive concepts may be applied.

Referring to FIG. 1, a semiconductor wafer 10 according to an example embodiment may include a plurality of chip areas 11. In an example embodiment, the chip areas 11 included in the semiconductor wafer 10 may include an integrated circuit, and may be separated into a plurality of semiconductor devices in a separation region defined between the chip areas 11 after a semiconductor process is undertaken.

An etching process may be a process for removing at least some regions among a plurality of layers included in the semiconductor wafer 10. In order to selectively remove only some regions among the plurality of layers, a mask pattern may be formed on the semiconductor wafer 10 before an etching process is undertaken. As part of creating the mask pattern, a photoresist layer may be formed on the semiconductor wafer 10 and exposed to the light in a specific wavelength band. The mask pattern may be formed by only removing regions of the photoresist layer that are exposed to light (e.g., a positive resist), or by only allowing some regions that are exposed to light to remain (e.g., a negative resist).

Figure 2:
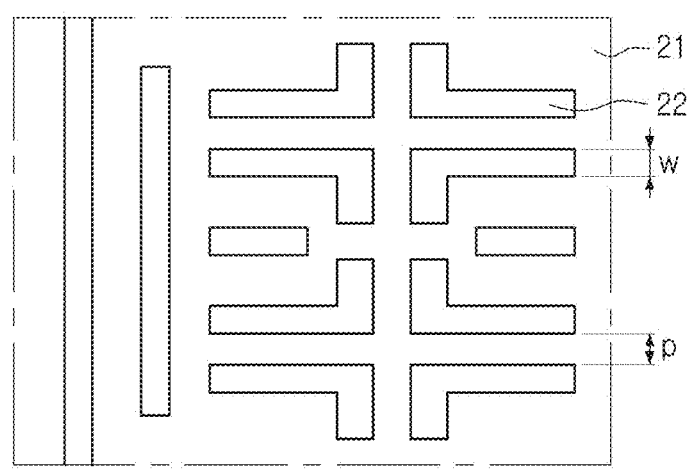
FIG. 2 is a schematic drawing illustrating a mask pattern according to an example embodiment of the present inventive concepts.

FIG. 2 is an enlarged view of the region 20 of the semiconductor wafer 10. Referring to FIG. 2, a mask pattern 22 may be formed above an etching target layer 21. The mask pattern 22 illustrated in FIG. 2 is an example embodiment, and the mask pattern 22 may be variously shaped according to a semiconductor device and a semiconductor pattern to be manufactured.

The mask pattern 22 may be defined by a shape and a width w of patterns and a distance p between adjacent patterns. A region of the etching target layer 21 located below the mask pattern 22 may not be removed while an etching process is undertaken, and regions of the etching target layer 21, exposed between mask patterns 22, may be removed while the etching process is undertaken.

In an example embodiment, a shape of a region of the etching target layer 21, exposed by the mask pattern 22, may be different from a shape of a region of the etching target layer 21 that is actually removed in the etching process. For example, the distance p between adjacent mask patterns 22 may be different from a width of a region of the etching target layer 21 that is actually removed. Stated another way, the area of the region of the etching target layer 21 that is actually removed by the etching process may differ from the intended etched area of the etching target layer 21 that is indicated by the mask pattern 22. Thus, in order to accurately form a desired semiconductor pattern in the etching process, it is beneficial to appropriately control the shape and the width w of the mask pattern 22 and the distance p between adjacent patterns.

Figure 3:
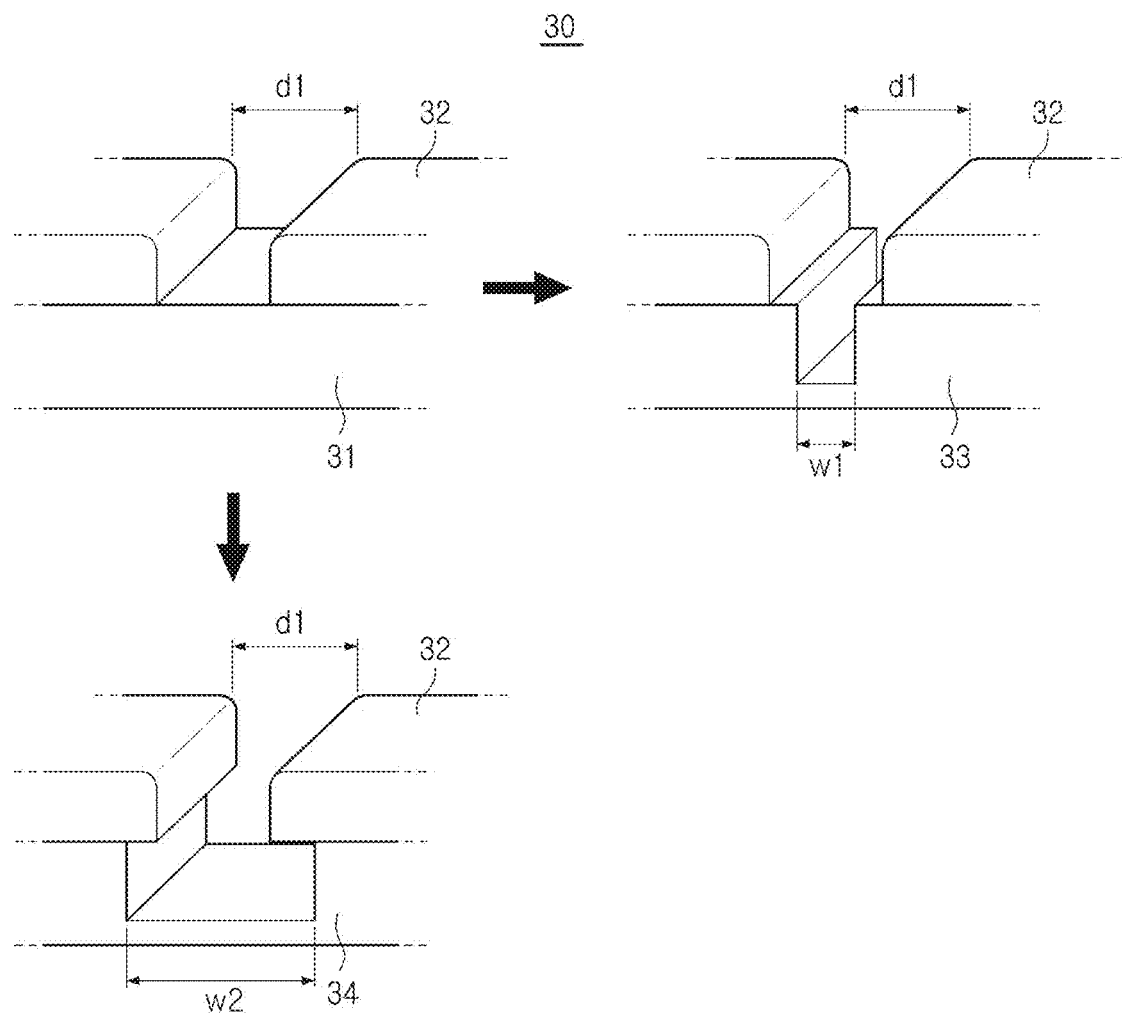
FIG. 3 is a drawing illustrating etch bias generated in an etching process according to an example embodiment of the present inventive concepts.

FIG. 3 is a drawing illustrating etch bias generated in an etching process according to an example embodiment of the present inventive concepts.

Referring to FIG. 3, in order to facilitate an etching process, a mask pattern 32 may be formed above an etching target layer 31 of a semiconductor wafer 30. The mask pattern 32 may be formed as a region from a photoresist material that is formed above the etching target layer 31 and is exposed to light in a specific wavelength band. The mask pattern 32 may be formed from the photoresist material that is removed or remains after the photoresist material is exposed to the light.

In an example embodiment illustrated in FIG. 3, a portion of an upper surface of the etching target layer 31 may be exposed externally by the mask pattern 32. In an example embodiment, mask patterns 32 may be separated from each other by a first distance d1, and the portion of an upper surface of the etching target layer 31 may be exposed between the mask patterns 32 that are separated from each other. When the etching process is undertaken, while etching particles are in contact with the etching target layer 31 exposed between the mask patterns 32, at least some regions of the etching target layer 31 may be removed.

As the etching target layer 31 is removed by an etching process undertaken after the mask pattern 32 is formed, the etching target layer 31 may have a trench having the first distance d1, or the etching target layer 31 may have a plurality of regions separated by the first distance d1. However, in some instances of an etching process, an etch bias problem may occur in which a width of a region of the etching target layer 31 that is removed is different from the first distance d1 between the mask patterns 32. That is to say that the actual portion of the material removed from the etching target layer 31 may differ from the first distance d1 that is designed for the mask pattern 32.

Etch bias may occur in the form in which the etching target layer 31 is excessively etched, as compared to the mask pattern 32, or the etching target layer 31 is not etched to a desired degree. Referring to FIG. 3, by means of different etch bias generated while the etching process is undertaken in the etching target layer 31 using the mask pattern 32, a first layer 33 and/or a second layer 34 may be obtained.

When a first width w1 of a region of the etching target layer 31 that is removed is narrower than the first distance d1 between the mask patterns 32, the etch bias illustrated as the first layer 33 of FIG. 3 may occur. When a second width w2 of a region of the etching target layer 31 that is removed is greater than the first distance d1 between the mask patterns 32, the etch bias illustrated as the second layer 34 of FIG. 3 may occur.

In order to significantly reduce the etch bias problems described above, various methods for predicting etch bias using a shape, a position, and the like, of the mask pattern 32 as parameters have been proposed. An etch bias prediction method using a polynomial in which the products of a plurality of kernels and respective coefficients are summed has been proposed. Kernel methods are tools used to analyze the relationship between input data and the corresponding output of a function. Kernels describe the properties of functions that allow algorithms to swap functions of varying complexity. In the method described above, an area of the mask pattern 32 that is to be adjacent a target area in which etch bias is to be measured, an area of an open region not covered by the mask pattern 32 around a target area, an area of a mask pattern 32 closest to a target area, and/or the like may be applied as a kernel.

An etch bias prediction process according to the method described above may be as follows. First, sample areas in which etch bias is to be measured are selected from a semiconductor wafer, and a value corresponding to the kernels may be extracted from each of the sample areas. Then, an etching process is undertaken on the semiconductor wafer, and an actual etch bias value is measured. With respect to each of the sample areas, the value corresponding to the kernels is substituted in the polynomial. Until an output value of the polynomial matches a measured value of the actual etch bias, a degree, a coefficient, and the like, of a polynomial, may be modified.

In the method described above, as etch bias is predicted using empirical characteristics, fitting accuracy may be high. In other words, with respect to each sample area, etch bias may be predicted with high accuracy using a polynomial generated according to the method described above. However, when etch bias by means of a mask pattern that is different from the sample areas is to be measured, an output value of the polynomial may be different from a measured value of the actual etch bias. In other words, the predicted etch bias may be accurate as long as the mask pattern is similar to the sample areas used for the empirical data, but may be less accurate for a mask pattern that is different.

In an example embodiment of the present inventive concepts, etch bias may be predicted using an artificial neural network, so the problem described above may be solved. In an example embodiment, a mask pattern may be formed in a semiconductor wafer, and sample areas in which etch bias is to be predicted are determined. Then, input parameters indicating physical characteristics affecting an etching process undertaken in a sample area may be extracted. An artificial neural network may receive the input parameters and generate an output value. The artificial neural network may learn by comparing the output value to a measured value of etch bias actually occurring in each sample area. When a difference between the output value and the measured value is a predetermined reference value or less, learning of the artificial neural network is completed (e.g., the artificial neural network has been "trained"). The artificial neural network in which learning is completed may be used as an etching effect prediction model.

Figure 4:
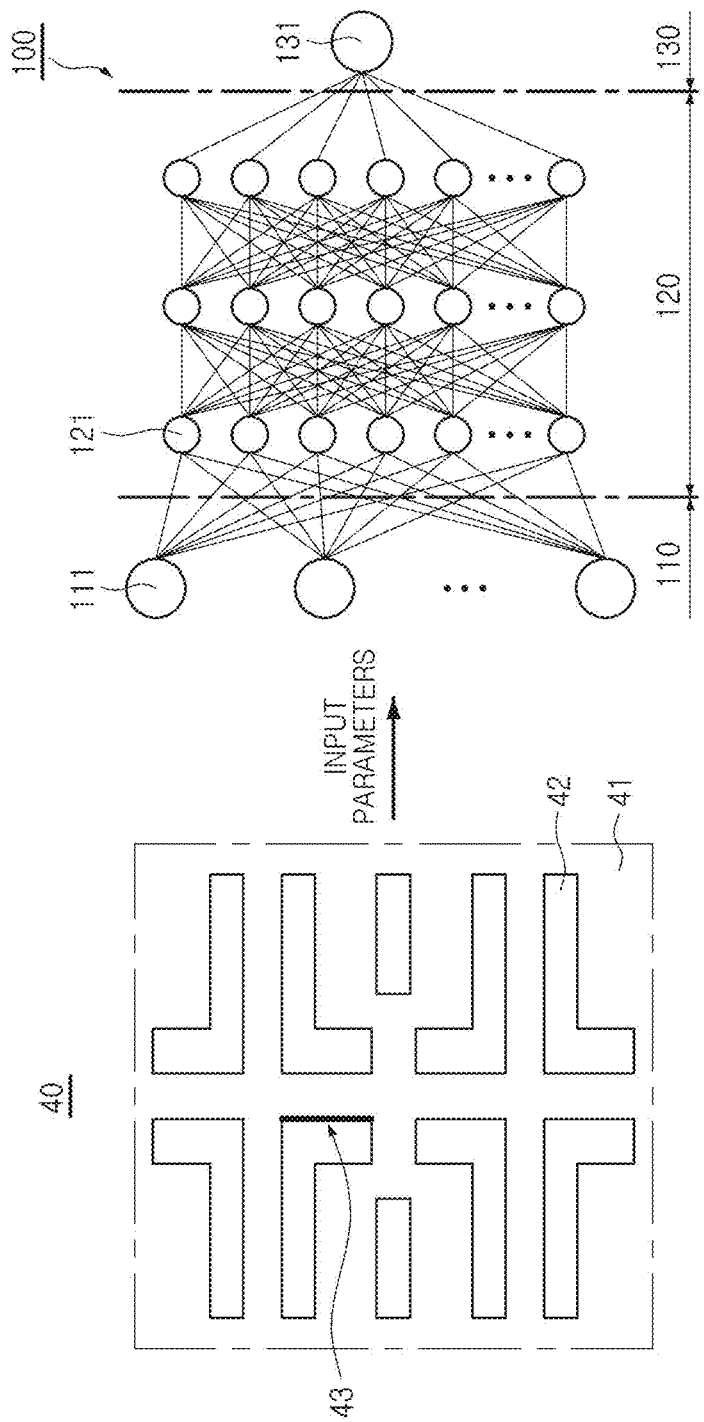
FIGS. 4 and 5 illustrate an etching effect prediction method according to an example embodiment of the present inventive concepts.
Figure 5:
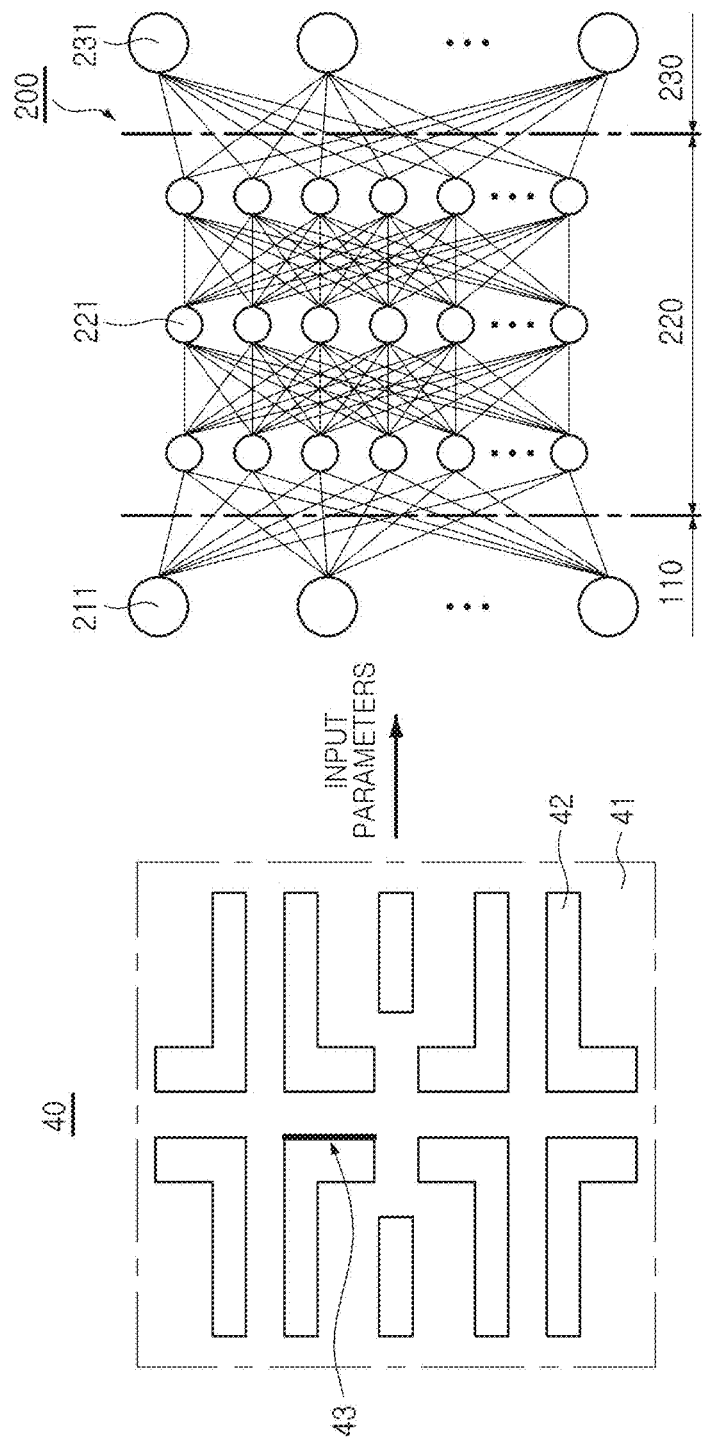

FIGS. 4 and 5 are drawings provided to illustrate an etching effect prediction method according to an example embodiment of the present inventive concepts. The etching effect prediction method according to an example embodiment may be provided in the form of a program executable on a computer device, and may be included in, for example, an electronic design automation (EDA) tool, or the like.

First, referring to FIG. 4, in a semiconductor wafer 40 on which a mask pattern 42 is formed on an etching target layer 41, a sample area 43 in which etch bias is to be measured may be selected. In an example embodiment illustrated in FIG. 4, for convenience of explanation, it is assumed that an artificial neural network 100 learns, on a single sample area 43. In some embodiments, a plurality of sample areas 43 may be selected from the semiconductor wafer 40, and the artificial neural network 100 may learn based on the plurality of sample areas 43. The artificial neural network 100 may learn using the plurality of sample areas 43, so an etching effect prediction accuracy of an artificial neural network in which learning is completed may be increased.

The artificial neural network 100 may include an input layer 110, a hidden layer 120, and an output layer 130. The input layer 110 may include a plurality of input nodes 111, the hidden layer 120 may include a plurality of hidden nodes 121, and the output layer 130 may include an output node 131. In an example embodiment illustrated in FIG. 4, the output layer 130 may include a single output node 131.

A plurality of input parameters determined in the sample area 43 may be input to the plurality of input nodes 111. The plurality of input parameters may indicate physical characteristics affecting an etching effect occurring in the sample area 43 using an etching process undertaken on the semiconductor wafer 40. In an example embodiment, the plurality of input parameters may include first input parameters representing an amount and a direction of etching particles moving toward the sample area 43, and second input parameters representing a slope of the mask pattern 42 adjacent to the sample area 43.

The plurality of input parameters may be arranged in a predetermined order and may be input to the plurality of input nodes 111. The hidden layer 120 of the artificial neural network 100 may perform a predetermined calculation using the plurality of input parameters, so an output value may be exported to the output node 131. In an example embodiment, the hidden layer 120 may perform the calculation in a manner in which all values input to the plurality of hidden nodes 121 are added, and/or in a manner in which 1 or 0 is sent to a subsequent node when the sum of values input to the plurality of hidden nodes 121 is greater than a predetermined threshold value, and/or in a manner in which a predetermined weighting value is applied to a value sent between the plurality of hidden nodes 121.

The artificial neural network 100 may compare the output value to a measured value, in which an etching process is actually undertaken on the semiconductor wafer 40 and etch bias is measured in the sample area 43 after the actual etching process is complete. As a comparison result, when a difference between the output value generated by the artificial neural network 100 and the measured value from the actual etching process is greater than a predetermined reference value, the artificial neural network 100 may regenerate the output value by adjusting the threshold value or the weighting value that is applied to a plurality of the hidden nodes 121 and performing the calculation again, and may recompare the output value to the measured value. The artificial neural network 100 may repeatedly perform a learning process of adjusting the threshold value or the weighting value until the output value is equal to the measured value or the difference between the output value and the measured value is equal to the reference value or less.

When the output value is equal to the measured value, or the difference between the output value and the measured value is equal to the reference value or less, learning of the artificial neural network 100 is completed, and the artificial neural network 100 in which learning is completed may be used as an etching effect prediction model. After a mask pattern for allowing an etching process to be undertaken is formed on an arbitrary semiconductor wafer and a target area for predicting etch bias is selected, input parameters in the target area are determined and may be input to the etching effect prediction model. In this case, the input parameters input to the etching effect prediction model may be determined from the target area in the same manner as that of determining input parameters in the sample area 43 in order to allow the artificial neural network 100 to learn.

Next, referring to FIG. 5, an artificial neural network 200 may include an input layer 210, a hidden layer 220, and an output layer 230. The input layer 210 may include a plurality of input nodes 211, and the hidden layer 220 may include a plurality of hidden nodes 221. In the artificial neural network 200 according to an example embodiment illustrated in FIG. 5, the output layer 230 may include a plurality of output nodes 231, in a different manner from that of the example embodiment illustrated in FIG. 4.

In an example embodiment illustrated in FIG. 5, a plurality of sample areas are selected from the semiconductor wafer 40, and the artificial neural network 200 may learn based on the plurality of sample areas. The artificial neural network 200 may learn, using a plurality of sample areas, so that the etching effect prediction accuracy of an artificial neural network 200 in which learning is completed may be increased. A learning process of the artificial neural network 200, a method of determining input parameters for learning of the artificial neural network 200, and the like, may be similar to those of the example embodiment illustrated in FIG. 4.

However, a difference caused by the output layer 230 including the plurality of output nodes 231 may occur. In the example embodiment illustrated in FIG. 5, each of the plurality of output nodes 231 included in the artificial neural network 200 may correspond to a section in which a value of etch bias occurring in the sample area 43 may be included. For example, when the number of the plurality of output nodes 231 is 5, a section corresponding to each of a first output node, a second output node, a third output node, a fourth output node, and a fifth output node, included in the plurality of output nodes 231, may be defined as illustrated in Table 1.

TABLE 1

| A plurality of output nodes | Corresponding section |
|---|---|
| First output node | 1.5 nm or more |
| Second output node | 1.5 nm or less to 0.5 nm or more |
| Third output node | 0.5 nm or less to −0.5 nm or more |
| Fourth output node | −0.5 nm or less to −1.5 nm or more |
| Fifth output node | −1.5 nm or less |

In Table 1, a sign of values defining respective sections may indicate a direction of etch bias. For example, the first output node and the second output node may correspond to scenarios in which the etching target layer 41 is excessively etched, as compared to the mask pattern 42. The fourth output node and the fifth output node may correspond to scenarios in which the etching target layer 41 is etched less, as compared to the mask pattern 42.

The artificial neural network 200 may set a value of one output node among the plurality of output nodes 231 to be different from a value of other output nodes in a learning process. For example, the artificial neural network 200 may set a value of one output node among the plurality of output nodes 231 to be 1, and may set a value of remaining output nodes to be 0. In some embodiments, when the value of one output node among the plurality of output nodes 231 is set to the value different from the remaining output nodes 231, it may indicate that the etch bias is predicted to be within the section corresponding to the one output node 231. For example, using the example illustrated in Table 1, if the one output node 231 is the third output node, then the etch bias is predicted to be "0.5 nm or less to −0.5 nm or more." When input parameters determined in the sample area 43 are input to the artificial neural network 200 and a value of one output node among the plurality of output nodes 231 is set to be 1, whether an actual etch bias measured value of the sample area 43 is included in a section corresponding to the output node in which a value is set to be 1 may be determined (e.g., the predicted value may be compared against the actual measured value). When the etch bias measured value of the sample area 43 is not included in the section corresponding to the output node in which the value is set to be 1, the artificial neural network 200 may be allowed to learn further.

When the actual etch bias measured value of the sample area 43 is included in the section corresponding to the output node in which the value is set to be 1, learning may be terminated, and the artificial neural network 200 may be used as an etching effect prediction model. After a mask pattern for allowing an etching process to be undertaken is formed in an arbitrary semiconductor wafer and a target area for predicting etch bias is selected, input parameters may be determined in the target area and may be input to the etching effect prediction model. An intermediate value of an output node in which a value is set to be 1 in an etching effect prediction model may be a value of etch bias predicted by the etching effect prediction model.

Figure 6:
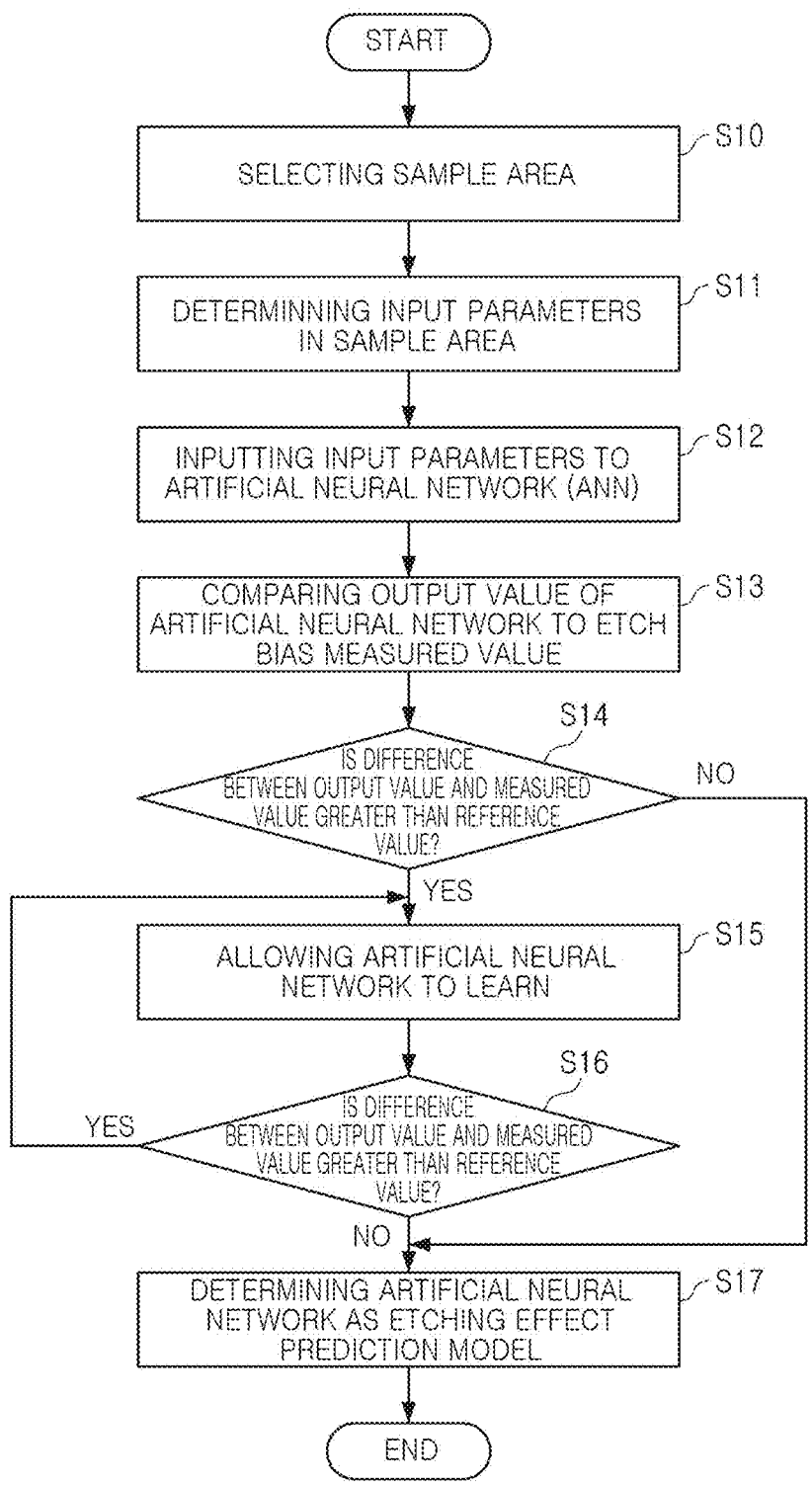
FIGS. 6 and 7 are flow diagrams illustrating an etching effect prediction method according to an example embodiment of the present inventive concepts.
Figure 7:
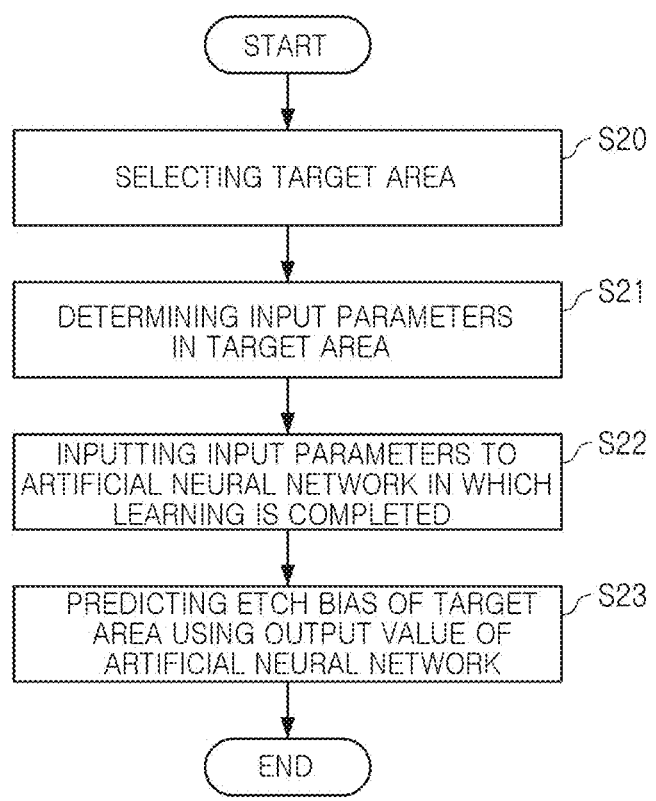

FIGS. 6 and 7 are flow diagrams illustrating an etching effect prediction method according to an example embodiment of the present inventive concepts.

Referring to FIG. 6, an etching effect prediction method according to an example embodiment may begin with selecting a sample area from a semiconductor wafer (S10). In an example embodiment, the sample area may be a plurality of regions selected from the semiconductor wafer on which a mask pattern is formed for an etching process. In S10, a plurality of sample areas may be selected.

Input parameters may be determined in the sample area selected in S10 (S11). The input parameters may be parameters indicating physical characteristics affecting an etching process undertaken in the sample area. In an example embodiment, the etching process undertaken in the sample area may be affected by density of a mask pattern formed in the sample area, a slope of a cross-section of a mask pattern formed in the sample area, and the like. The input parameters may include information corresponding to density of a mask pattern, a slope of a cross-section of a mask pattern, and the like.

The input parameters may be input to an artificial neural network (ANN) (S12). The artificial neural network may include a plurality of input nodes, and the input parameters may be arranged in a predetermined order and may be input to the plurality of input nodes. The artificial neural network receiving the input parameters may modify information such as a threshold value and a weighting value, used in a hidden layer, through a learning process. Hereinafter, this will be described with reference to S13 to S16.

The artificial neural network may output an output value using the input parameters, and may compare the output value to a measured value of etch bias actually occurring in the sample area (S13). In some embodiments, the measured value may be a result of an etching process performed on a semiconductor wafer having a same or similar sample area as that selected in S20. The artificial neural network may compare the output value to the measured value to determine whether a difference between the output value and the measured value is greater than a predetermined reference value (S14).

As a result of S14, when the difference between the output value and the measured value is greater than the predetermined reference value, the artificial neural network may be determined to require a learning process. Thus, in each of hidden nodes included in a hidden layer, a learning process for correcting information such as a threshold value and/or a weighting value used for calculation, and the like, may be undertaken (S15). After learning, the artificial neural network may determine whether a difference between an output value and a measured value is greater than the reference value by generating the output value using the input parameters again and comparing the output value to the measured value (S16). As a result of S16, in the case that the difference between the output value and the measured value remains greater than the reference value, the learning process of S15 may be repeatedly performed.

As a result of S14 or S16, when the difference between the output value and the measured value is lower than the reference value, learning of the artificial neural network may be terminated, and the artificial neural network may be determined as an etching effect prediction model (S17). Hereinafter, in a case in which etch bias is to be predicted by specifying a target area of a semiconductor wafer, input parameters are determined in the target area, and the input parameters may be input to input nodes of the etching effect prediction model. Hereinafter, this will be described with reference to FIG. 7.

Next, referring to FIG. 7, an etching effect prediction method according to an example embodiment may begin with selecting a target area from a semiconductor wafer (S20). In an example embodiment, the target area may be selected from the semiconductor wafer on which a mask pattern for allowing an etching process to be undertaken is formed.

When the target area is selected, input parameters may be extracted from the target area (S21). In an example embodiment, a method of determining input parameters from the target area may be the same, or similar, as the method of determining input parameters from the sample area in S11 of the example embodiment illustrated in FIG. 6.

The input parameters extracted from the target area may be input to input nodes of the artificial neural network (S22). In this case, the artificial neural network may be an artificial neural network in which learning is completed and which is determined as an etching effect prediction model (e.g., S17 of FIG. 6). Moreover, in an example embodiment, the input parameters determined from the target area may be arranged in the same order as that of input parameters determined from the sample area and may be input to the artificial neural network.

The output value that the artificial neural network exports to the output node may be a value of etch bias which is predicted to occur in the target area when the etching process is undertaken on the semiconductor wafer. In other words, from the output value of the artificial neural network, an etch bias of the target area may be predicted (S23). A shape of a mask pattern may be adjusted with reference to etch bias of the target area, predicted in S23, so the etching target layer may be accurately etched to have a desired shape, pitch, line width, or the like. In some embodiments, the adjusted mask pattern may then be used to perform the etching process on the semiconductor wafer during the formation of a semiconductor device.

In an example embodiment, the artificial neural network is allowed to learn so that an etching effect prediction model capable of predicting an etching effect may be generated. After a plurality of sample areas are selected from a semiconductor wafer, input parameters in each of the sample areas are selected using a predetermined method, and the input parameters may be input to the artificial neural network. An output value of the artificial neural network may be compared to a measured value of etch bias occurring in each of the sample areas after an actual etching process is undertaken on the semiconductor wafer, and the artificial neural network may learn until the output value is equal to the measured value, or a difference between the output value and the measured value is equal to a predetermined reference value or less.

The input parameters may indicate physical characteristics affecting an etching process undertaken in each of the sample areas. In an example embodiment, the input parameters may include first input parameters corresponding to an amount of etching particles in contact with the sample area while an etching process is undertaken, and second input parameters corresponding to a shape of a mask pattern adjacent to the sample area. Hereinafter, with reference to FIGS. 8 through 14, a method of determining input parameters will be described.

Figure 8:
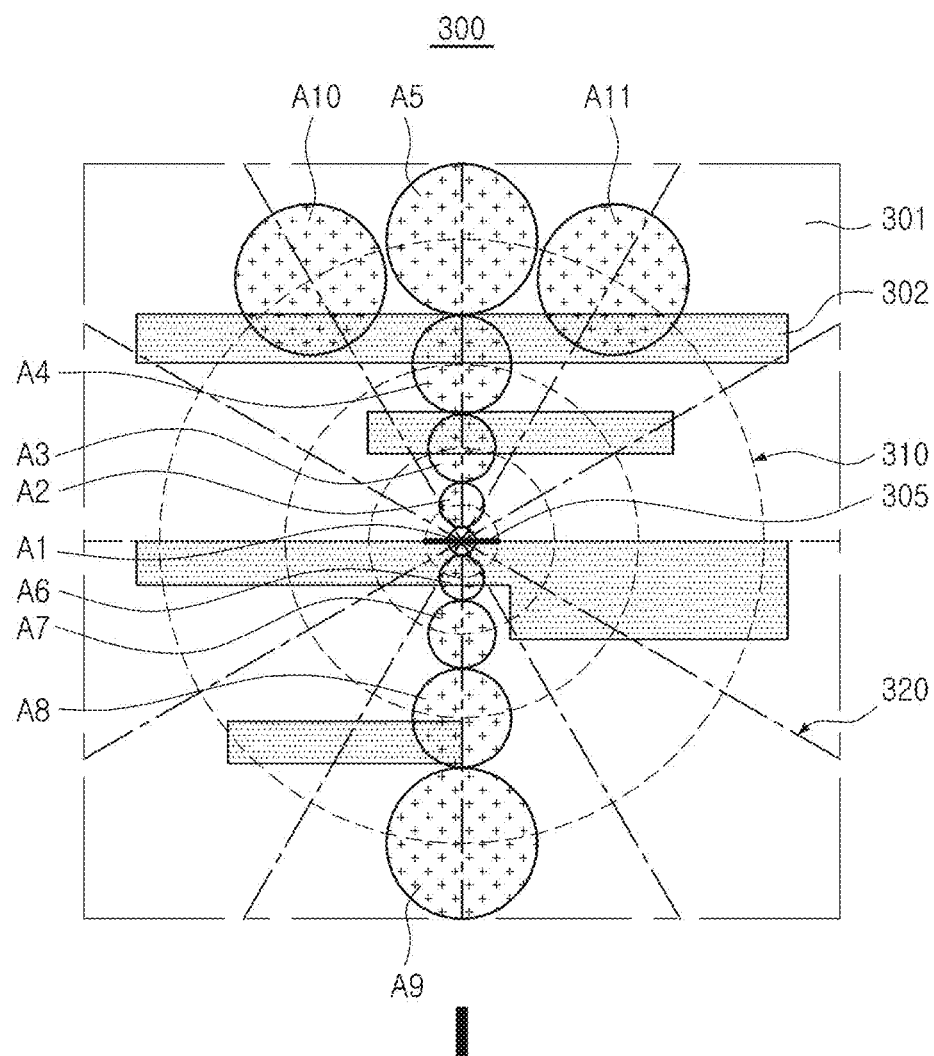
FIGS. 8 through 10 are plan views illustrating a method of determining an input parameter in an etching effect prediction method according to an example embodiment of the present inventive concepts.
Figure 9:
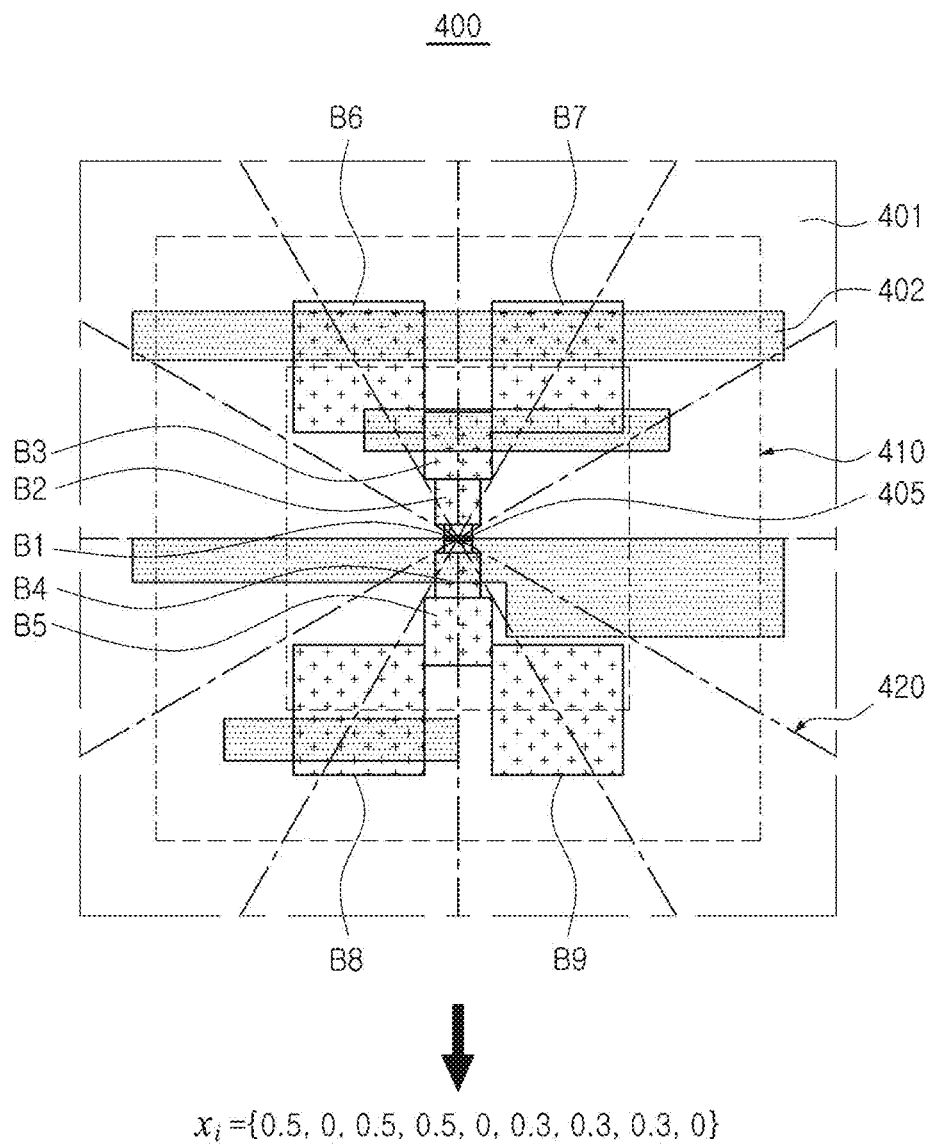
Figure 10:
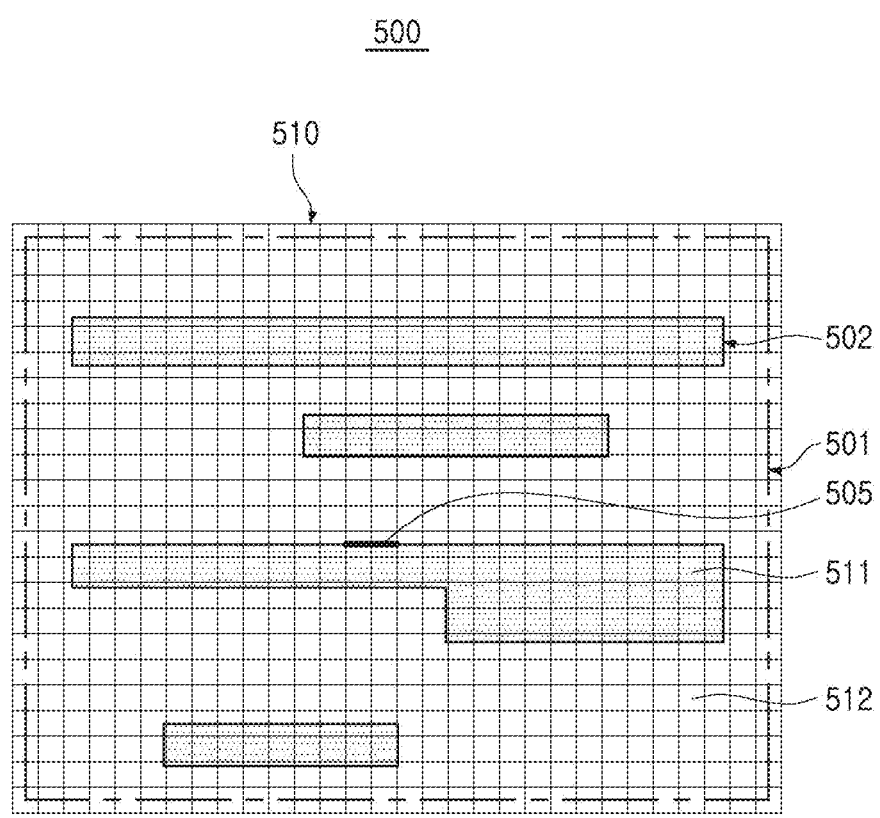

FIGS. 8 through 10 are plan views illustrating a method of determining an input parameter in an etching effect prediction method according to an example embodiment of the present inventive concepts. Example embodiments illustrated in FIGS. 8 through 10 may correspond to a method of determining first input parameters corresponding to an amount of etching particles in contact with a sample area while an etching process is undertaken.

While an etching process is undertaken, etching particles may move to a sample area from an upper portion of the sample area. In an example embodiment, an amount of etching particles which may be in contact with the sample area may be affected by density of a mask pattern formed around the sample area. Thus, a value related to density of a mask pattern formed around the sample area based on the sample area is extracted so that first input parameters may be determined.

First, referring to FIG. 8, a sample area 305 is selected from a semiconductor wafer 300, including an etching target layer 301 and a mask pattern 302 thereabove, and virtual concentric circles 310 and virtual lines 320 may be generated based on the sample area 305. In at least a portion of points in which the concentric circles 310 and the lines 320 intersect, density measurement areas A1 to A11 for calculating density of a mask pattern may be defined.

The density measurement areas A1 to A11 are defined at points in which the concentric circles 310 and the lines 320 intersect. In some embodiments, the density measurement areas A1 to A11 may have a larger area as a distance from the sample area 305 is increased. A position (e.g., a location) of the density measurement areas A1 to A11 may be represented by polar coordinates having the sample area 305 as the center, and may correspond to a direction in which etching particles move toward the sample area 305.

At least a portion among the density measurement areas A1 to A11 may overlap the mask pattern 302. The mask pattern 302 may act as an obstacle in progression of etching particles toward the sample area 305. Thus, an area ratio of the mask pattern 302 occurring in each of the density measurement areas A1 to A11 may correspond to an amount of etching particles moving toward the sample area 305 in a position corresponding to the density measurement areas A1 to A11. For example, the area ratio may be defined as a ratio of an area in which each of the density measurement areas A1 to A11 overlaps the mask pattern 302 with respect to a total area of each of the density measurement areas A1 to A11.

An area ratio of the mask pattern 302 calculated in each of the density measurement areas A1 to A11 may be arranged in order and may be used as a first input parameter $x_i$. Referring to FIG. 8, respective area ratios of the first density measurement area A1 to the eleventh density measurement area A11 are arranged in order, and the first input parameter $x_i$ may be defined. In an example embodiment illustrated in FIG. 8, the area ratio of each of the density measurement areas A1 to A11 may be as illustrated in Table 2. In the example embodiment illustrated in FIG. 8, the arrangement of the first density measurement area A1 to the eleventh density measurement area A11 is in order, but the order of arrangement may be various modified.

TABLE 2

| A1 | A2 | A3 | A4 | A5 | A6 | A7 | A8 | A9 | A10 | A11 |
|---|---|---|---|---|---|---|---|---|---|---|
| 0.5 | 0 | 0.5 | 0.5 | 0 | 0.5 | 0 | 0.25 | 0 | 0.2 | 0.2 |

Referring to FIG. 9, a sample area 405 may be selected from a semiconductor wafer 400, including an etching target layer 401 and a mask pattern 402 thereabove, and virtual quadrangles 410 and virtual lines 420 may be generated based on the sample area 405. The center of each of the quadrangles 410 may be the sample area 405, and the lines 420 may intersect each other in the sample area 405.

In at least a portion among points in which the quadrangles 410 and the lines 420 intersect, density measurement areas B1 to B9 for calculating density of a mask pattern 402 may be defined. In a similar manner to the example embodiment of FIG. 8, a position of each of the density measurement areas B1 to B9 may correspond to a direction in which etching particles move toward the sample area 405, and an area ratio of each of the density measurement areas B1 to B9 may correspond to an amount of etching particles moving toward the sample area 405 in a position corresponding to the density measurement areas B1 to B9. For example, the area ratio may be defined as a ratio of an area in which each of the density measurement areas B1 to B9 overlaps the mask pattern 402 with respect to a total area of each of the density measurement areas B1 to B9. In an example embodiment illustrated in FIG. 9, an area ratio of each of the density measurement areas B1 to B9 may be as illustrated in Table 3.

TABLE 3

| B1 | B2 | B3 | B4 | B5 | B6 | B7 | B8 | B9 |
|----|----|----|----|----|----|----|----|----|
| 0.5 | 0 | 0.5 | 0.5 | 0 | 0.3 | 0.3 | 0.3 | 0 |

Referring to FIG. 10, a sample area 505 may be selected from a semiconductor wafer 500, including an etching target layer 501 and a mask pattern 502 thereabove, and a pattern image 510 which may cover some regions of the semiconductor wafer 500 based on the sample area 505 may be defined. In some embodiments, the pattern image 510 may be a bitmap image including a plurality of pixels.

Referring to FIG. 10, the pattern image 510 may include first pixels 511 overlapping a portion of the mask pattern 502, and second pixels 512 not overlapping the mask pattern 502. In an etching effect prediction method according to an example embodiment, a first value is assigned to the first pixels 511, and a second value is assigned to the second pixels 512.

First input parameters corresponding to an amount of etching particles in contact with the sample area may be determined by arranging the first value assigned to the first pixels 511 and the second value assigned to the second pixels 512 in a predetermined order. In an example embodiment, in the etching effect prediction method according to an example embodiment, the first value and the second value are arranged in the order of coordinates of pixels included in the pattern image 510, such as the first pixels 511 and the second pixels 512, so the first input parameters may be determined.

As illustrated with reference to FIGS. 8 through 10, with respect to the mask patterns 302, 402, and 502 having the same shape and the sample areas 305, 405, and 505 defined in the same position, input parameters may be different according to the method of determining input parameters. Thus, a method of extracting input parameters from the sample areas 305, 405, and 505, for allowing an artificial neural network to learn may be the same as a method of extracting input parameters from a target area of a semiconductor wafer in which an etching effect is to be predicted.

FIGS. 11 through 14 are drawings illustrating a method of determining an input parameter in an etching effect prediction method according to an example embodiment of the present inventive concepts. A method illustrated with reference to example embodiments in FIGS. 11 through 14 may correspond to a method of determining second input parameters corresponding to a shape of a mask pattern formed in a semiconductor wafer.

While an etching process is undertaken, a speed in which an etching target layer exposed by a mask pattern is removed (e.g., an amount, a shape, and the like) may be affected by an angle of inclination (a slope) formed by a cross-section of the mask pattern with an upper surface of the etching target layer. The angle of inclination of the cross-section of the mask pattern may be determined by characteristics of light used when a photoresist layer is exposed in order to form the mask pattern, for example, an intensity distribution of the light. The intensity distribution of light may be expressed as an aerial image.

Figure 11:
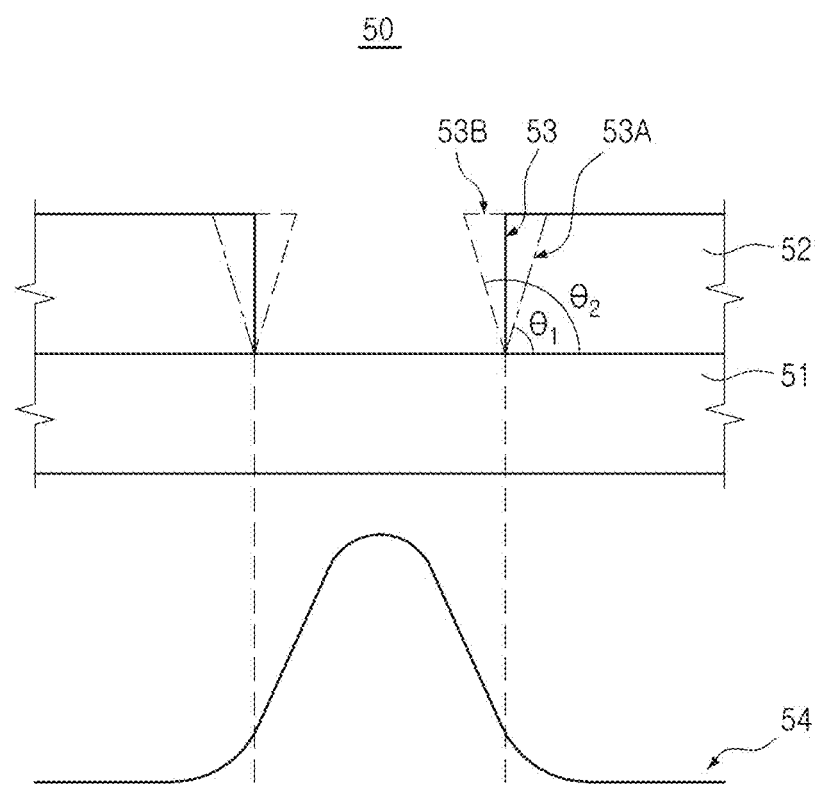
FIGS. 11 through 14 are drawings illustrating a method of determining an input parameter in an etching effect prediction method according to an example embodiment of the present inventive concepts.

Referring to FIG. 11, a mask pattern 52 formed on an etching target layer 51 of a semiconductor wafer 50 may have various angles of inclination. In an ideal case, a cross-section 53 of the mask pattern 52 may form an angle of inclination of 90 degrees with respect to an upper surface of the etching target layer 51. On the other hand, angles of inclination $\theta_1$ and $\theta_2$ formed by each of possible cross-sections 53A and 53B of the mask pattern 52 with respect to the upper surface of the etching target layer 51 may be greater or less than 90 degrees.

The intensity distribution of light determining an angle of inclination of a cross-section of the mask pattern 52 may be expressed as the distribution curve 54. The distribution curve 54 may be expressed using various kernels and may be represented as an aerial image, which, in some embodiments, may illustrate the distribution of light as seen in plan view of the semiconductor wafer. The aerial image may be represented by, for example, a polynomial equation such as Equation 1.

$$\text{Aerial Image} = C_0 + C_1 * K_1 + C_2 * K_2 + C_3 * K_3 + \quad \text{[Equation 1]}$$

For example, kernels used to express an aerial image, such as Equation 1, may be a Fourier-Bessel function, a sum of coherent systems (SOCS), a Zernike polynomial, and the like. The kernels may be represented as respective images contributing to the aerial image. In an example embodiment, an image of each of the kernels may overlap a pattern image including a mask pattern to form overlapping images, and a predetermined weighting value may be applied to a first pixel in which a mask pattern occurs in each of the overlapping images. The weighting value applied to the first pixel may be multiplied by a value of the kernels corresponding to a position of the first pixel and the product thereof is then added so that second input parameters may be determined. The second input parameters may be arranged in the order of contribution which each of the kernels has with respect to the aerial image and may be input to an artificial neural network. In some embodiments, the contribution of the kernels to the aerial image may have an order that is determined by a lithography simulator.

Figure 12:
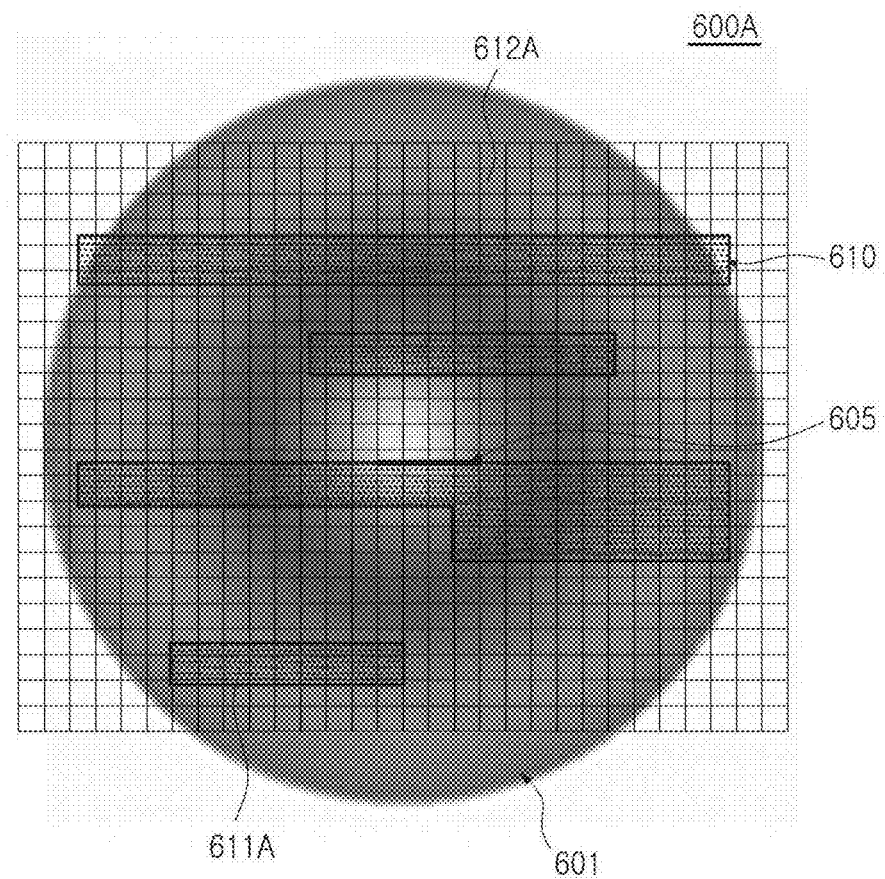
Figure 13:
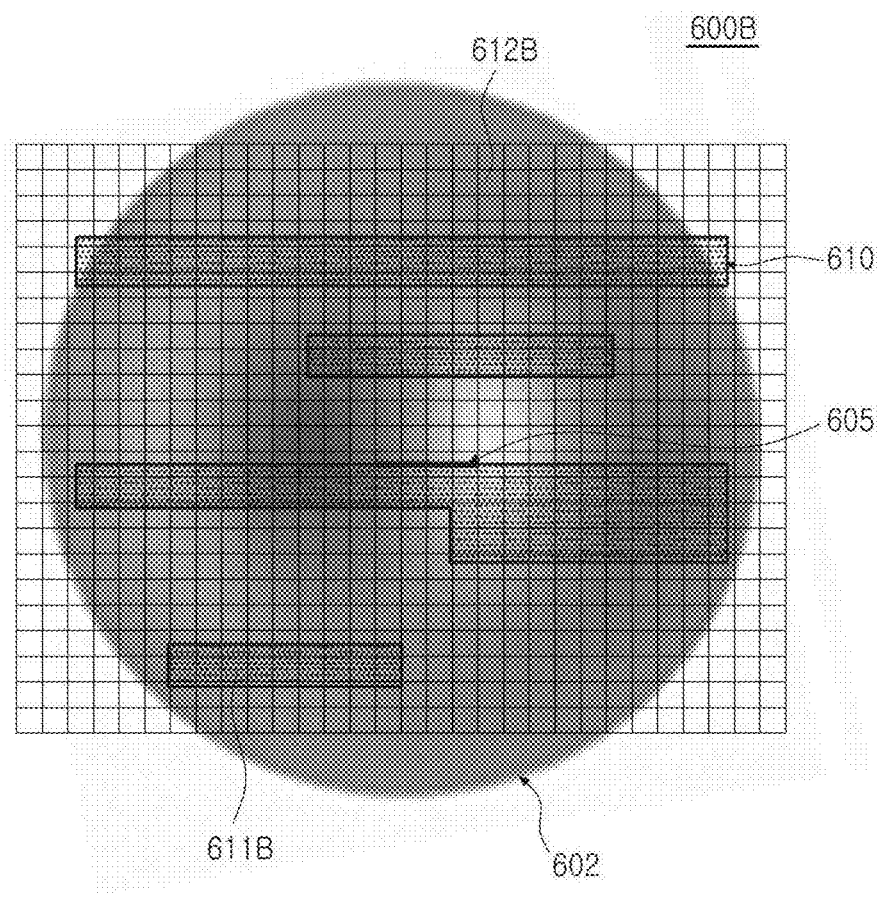
Figure 14:
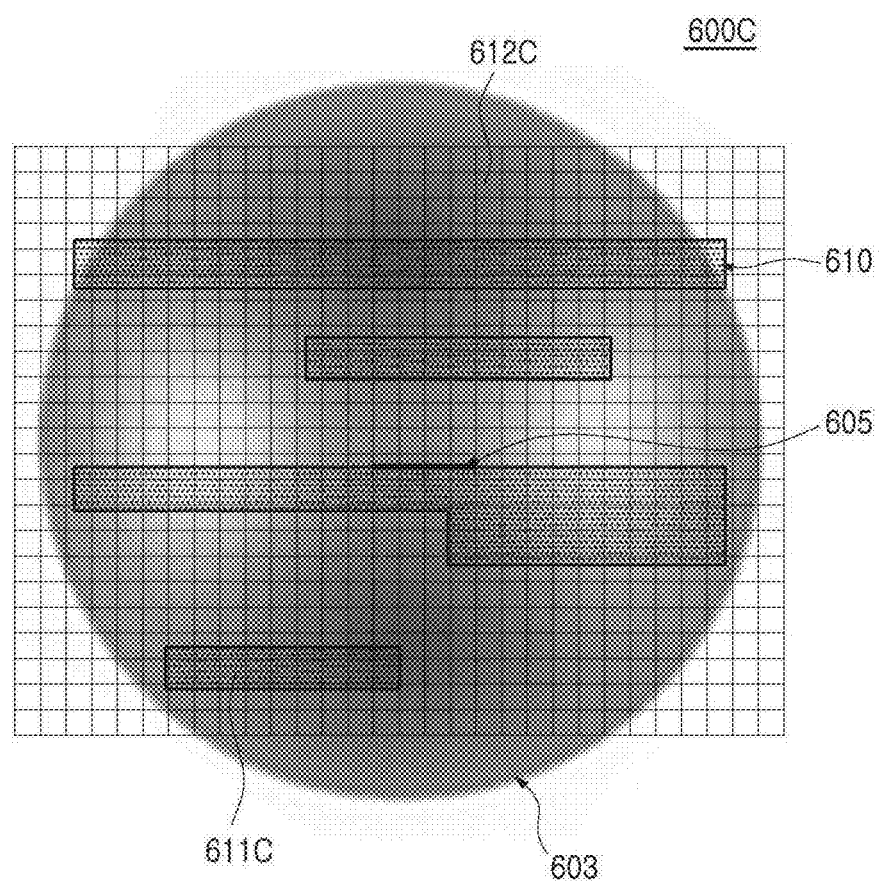

FIGS. 12 through 14 are drawings provided to illustrate a method of determining second input parameters, when the kernels defining an aerial image are selected as a Fourier-Bessel function. In an example embodiment illustrated in FIGS. 12 through 14, an aerial image showing intensity distribution of light used for forming a mask pattern 610 in a lithography process may be assumed to be expressed as Equation 2. In Equation 2, each of $\psi_{30}$, $\psi_{21}$, and $\psi_{12}$ may correspond to a Fourier-Bessel function.

$$\text{Aerial Image} = C_0 + C_1 * \psi_{30} + C_2 * \psi_{21} + C_3 * \psi_{12} + \quad \text{[Equation 2]}$$

First, referring to FIG. 12, a first kernel aerial image 601 defined by a first Fourier-Bessel function $\psi_{30}$ overlaps the mask pattern 610 to form a first overlapping image 600A. In the first overlapping image 600A, a sample area 605 in which an etching effect (e.g., etch bias) is to be predicted may be included therein.

In the etching effect prediction method according to an example embodiment, in the first overlapping image 600A, first pixels 611A on which a portion of the mask pattern 610 is placed and second pixels 612A on which the mask pattern 610 is not placed may be determined. A predetermined weighting value may be applied to each of the first pixels 611A and second pixels 612A. For example, 1 may be applied to the first pixels 611A, while 0 may be applied to the second pixels 612A. The weighting value may be variously modified according to example embodiments. In an example embodiment, the weighting value may be determined in proportion to an area of the mask pattern 610 placed on each pixel, of the first pixels 611A and the second pixels 612A.

In the first overlapping image 600A, each pixel, of the first pixels 611A and the second pixels 612A, may have a value corresponding to the first Fourier-Bessel function $\psi_{30}$. The etching effect prediction method according to an example embodiment may set a pixel value in each pixel of the first pixels 611A and the second pixels 612A by multiplying a value of the first Fourier-Bessel function $\psi_{30}$ of each pixel of the first pixels 611A and the second pixels 612A and the weighting value applied to the first pixels 611A and the second pixels 612A beforehand. The sum of the pixel value may be selected as a primary second input parameter. In some embodiments, the primary second input parameter, as indicated by the first Fourier-Bessel function $\psi_{30}$, may have the largest contribution to the distribution of light illustrated by the first kernel aerial image 601.

Next, referring to FIG. 13, a second kernel aerial image 602 defined by a second Fourier-Bessel function $\psi_{21}$ overlaps the mask pattern 610 to form a second overlapping image 600B. As described above with reference to FIG. 12, in the etching effect prediction method according to an example embodiment, in the second overlapping image 600B, first pixels 611B on which a portion of the mask pattern 610 is placed, and second pixels 612B on which the mask pattern 610 is not placed may be selected. A predetermined weighting value may be applied to each of the first pixels 611B and the second pixels 612B.

Each pixel, of the first pixels 611B and the second pixels 612B, included in the second overlapping image 600B, may have a value corresponding to the second Fourier-Bessel function $\psi_{21}$. Thus, a value of each pixel, of the first pixels 611B and the second pixels 612B included in the second overlapping image 600B may be different from a value of each pixel of the first pixels 611A and the second pixels 612A included in the first overlapping image 600A. The etching effect prediction method according to an example embodiment may set a pixel value in each pixel of the first pixels 611B and the second pixels 612B by multiplying a value of the second Fourier-Bessel function $\psi_{21}$ of each pixel of the first pixels 611B and the second pixels 612B and the weighting value applied to the first pixels 611B and the second pixels 612B beforehand. The sum of the pixel value may be selected as a secondary second input parameter. In some embodiments, the secondary second input parameter, as indicated by the second Fourier-Bessel function $\psi_{21}$, may have the second largest contribution to the distribution of light illustrated by the second kernel aerial image 602.

Referring to FIG. 14, a third kernel aerial image 603 defined by a third Fourier-Bessel function $\psi_{12}$ overlaps the mask pattern 610 to form a third overlapping image 600C. As described above with reference to FIGS. 12 and 13, in the etching effect prediction method according to an example embodiment, in the third overlapping image 600C, first pixels 611C on which a portion of the mask pattern 610 is placed and second pixels 612C on which the mask pattern 610 is not placed may be selected. A predetermined weighting value may be applied to each of the first pixels 611C and the second pixels 612C.

Each pixel of the first pixels 611C and the second pixels 612C included in the third overlapping image 600C, may have a value corresponding to a third Fourier-Bessel function $\psi_{12}$. Thus, each pixel of the first pixels 611C and the second pixels 612C included in the third overlapping image 600C, may be different from a value of the first pixels 611A, the second pixels 612A, the first pixels 611B, and/or the second pixels 612B included in each of the first overlapping image 600A and the second overlapping image 600B. The etching effect prediction method according to an example embodiment may set a pixel value in each pixel of the first pixels 611C and the second pixels 612C by multiplying a value of a third Fourier-Bessel function $\psi_{12}$ of each pixel of the first pixels 611C and the second pixels 612C and the weighting value applied to the first pixels 611C and the second pixels 612C beforehand. The sum of the pixel value may be selected as a tertiary second input parameter. In some embodiments, the tertiary second input parameter, as indicated by the third Fourier-Bessel function $\psi_{12}$, may have the third largest contribution to the distribution of light illustrated by the third kernel aerial image 603.

The primary second input parameters, the secondary second input parameters, and the tertiary second input parameters, determined by the example embodiments illustrated in FIGS. 12 through 14, may be arranged in order and may be input to input nodes of an artificial neural network. In some embodiments, the first input parameters, determined by the example embodiments illustrated in FIGS. 8 through 10, may also be arranged in order, and may be input to input nodes of an artificial neural network. When learning of the artificial neural network is completed before the artificial neural network is applied as an etching effect prediction model, the artificial neural network may compare an output value generated from second input parameters having been received, to a measured value of etch bias actually occurring in the sample area 605, and learning may be undertaken according to a comparison result. When the difference between the output value and the measured value is equal to a predetermined reference value or less, learning is terminated, and the artificial neural network may be determined as the etching effect prediction model. When etch bias of a target area selected from a semiconductor wafer is predicted using the artificial neural network determined as the etching effect prediction model, second input parameters are determined in the target area using the same method as example embodiments described with reference to FIGS. 12 through 14 previously and may be input to the artificial neural network determined as the etching effect prediction model.

The first input parameters determined according to the example embodiments illustrated in FIGS. 8 through 10 as well as the second input parameters determined according to the example embodiments illustrated in FIGS. 11 through 14 are arranged in the predetermined order and may be input to the artificial neural network as an input parameter. An arrangement order of an input parameter determined from a sample area selected from a semiconductor wafer in order to allow the artificial neural network to learn, may be the same as an arrangement order of an input parameter determined from a target area selected from a semiconductor wafer in order to predict etch bias before an etching process is undertaken.

As set forth above, according to example embodiments of the present inventive concept, an etching effect prediction method may allow an artificial neural network (ANN) to learn by inputting input parameters indicating physical and optical characteristics affecting an etching process to the artificial neural network, and the artificial neural network in which learning is completed may be used as an etching effect prediction model. Thus, an etching effect including a difference between a mask pattern and a semiconductor pattern may be accurately predicted, and a mask pattern for accurately forming a desired semiconductor pattern may be formed therefrom. The mask pattern may subsequently be used in an etching process for forming a semiconductor device.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

The various operations of methods described above may herein performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, and/or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While example embodiments have been shown and described above, it will be apparent to those skilled in the art that modifications and variations could be made without departing from the scope of the present disclosure, as defined by the appended claims.

What is claimed is:

1. An etching effect prediction method comprising:
   determining a sample area of a mask pattern for which etch bias is to be predicted;
   determining input parameters indicating physical characteristics affecting an etching process undertaken in the sample area;
   comparing an output value obtained by inputting the input parameters to an artificial neural network to a measured value of the etch bias that occurred in the sample area; and
   allowing the artificial neural network to learn until a difference between the output value and the measured value is equal to or less than a predetermined reference value,
   wherein the input parameters comprise:
      first input parameters corresponding to an amount of etching particles in contact with the sample area while the etching process is undertaken; and
      second input parameters corresponding to a shape of the mask pattern adjacent to the sample area, and
   wherein the determining the input parameters comprises:
      defining a plurality of density measurement areas around the sample area, and calculating an area ratio occupied by the mask pattern in each of the plurality of density measurement areas; and
      determining the first input parameters by arranging the area ratio calculated in each of the plurality of density measurement areas in a predetermined order.

2. The etching effect prediction method of claim 1, wherein the sample area includes a plurality of sample areas in different locations, and
   wherein the method further comprises:

inputting the input parameters determined in each of the plurality of sample areas to the artificial neural network.

3. The etching effect prediction method of claim 1, wherein the calculating the area ratio comprises:
defining a plurality of figures on the mask pattern having the sample area as a center;
defining a plurality of lines on a surface of the mask pattern that pass through the sample area; and
defining the plurality of density measurement areas at intersection points where the plurality of figures meet the plurality of lines.

4. The etching effect prediction method of claim 1, wherein the plurality of density measurement areas have a larger area as the plurality of density measurement areas become farther from the sample area.

5. The etching effect prediction method of claim 1, wherein the area ratio calculated in each of the plurality of density measurement areas is determined according to a position of each of the plurality of density measurement areas based on the sample area to determine the first input parameters.

6. The etching effect prediction method of claim 1, wherein the determining the input parameters further comprises:
generating a pattern image including the sample area;
assigning a first value to first pixels in which a portion of the mask pattern occurs, among pixels included in the pattern image;
assigning a second value to second pixels, different from the first pixels, among the pixels included in the pattern image; and
determining the first input parameters by arranging respective values of the pixels included in the pattern image in a predetermined order.

7. The etching effect prediction method of claim 1, wherein the determining the input parameters further comprises:
generating an aerial image showing intensity distribution of light used in a lithography process forming the mask pattern with a plurality of kernels; and
determining the second input parameters by arranging a value of first kernels with high contribution to the aerial image among the plurality of kernels in a predetermined order.

8. The etching effect prediction method of claim 7, wherein the determining the second input parameters comprises:
generating a plurality of overlapping images by overlapping a pattern image including the sample area and an image of each of the first kernels;
determining first pixels on which a portion of the mask pattern is placed in each of the plurality of overlapping images;
calculating a sum of a value of the first kernels corresponding to the first pixels in each of the plurality of overlapping images; and
determining the second input parameters by arranging the sum of the value of the first kernels that are calculated for each of the plurality of overlapping images in the predetermined order of a contribution to the aerial image.

9. The etching effect prediction method of claim 7, wherein the plurality of kernels comprise a Fourier-Bessel function, a sum of coherent systems (SOCS), and/or a Zernike polynomial.

10. The etching effect prediction method of claim 7, wherein a contribution of the plurality of kernels to the aerial image has an order determined by a lithography simulator.

11. The etching effect prediction method of claim 1, wherein the artificial neural network comprises a plurality of input nodes, a single output node, and a plurality of hidden nodes connected between the plurality of input nodes and the single output node.

12. The etching effect prediction method of claim 1, wherein the artificial neural network comprises a plurality of input nodes, a plurality of output nodes, and a plurality of hidden nodes connected between the plurality of input nodes and the plurality of output nodes, and
wherein each of the plurality of output nodes corresponds to a section in which etch bias occurring in the sample area is to be included.

13. The etching effect prediction method of claim 12, wherein the artificial neural network sets a first value of an output node among the plurality of output nodes to be 1 and sets a second value of remaining ones among the plurality of output nodes to be 0.

14. The etching effect prediction method of claim 1, wherein operating the artificial neural network comprises adjusting a weighting value and a threshold value of each of a plurality of hidden nodes included in the artificial neural network until the difference between the output value and the measured value is less than or equal to the predetermined reference value.

15. The etching effect prediction method of claim 1, further comprising:
using the artificial neural network to generate a prediction of the etch bias of the etching process for the mask pattern;
responsive to the prediction of the etch bias from the artificial neural network, adjusting the mask pattern to form an adjusted mask pattern; and
forming a semiconductor device using the adjusted mask pattern.

16. The etching effect prediction method of claim 1, further comprising:
selecting a target area in which the etch bias is to be predicted;
inputting the input parameters to the artificial neural network by calculating the input parameters in the target area; and
predicting the etch bias of the target area using the output value of the artificial neural network.

17. An etching effect prediction method comprising:
determining a sample area of a mask pattern for which etch bias is to be predicted;
determining first input parameters corresponding to an amount of etching particles in contact with each of a plurality of sample areas of the mask pattern;
determining second input parameters corresponding to a shape of the mask pattern adjacent to each of the plurality of sample areas;
providing the first input parameters and the second input parameters to an artificial neural network;
comparing an output value obtained from the artificial neural network based on the first input parameters and the second input parameters to a measured value of the etch bias that occurred in the sample area; and
repeating operation of the artificial neural network until a difference between the output value and the measured value is equal to or less than a predetermined reference value, wherein the determining the second input parameters comprises:
  generating a plurality of overlapping images by overlapping a pattern image including the sample area with a plurality of first images respectively based on a plurality of first kernels;
  determining first pixels on which a portion of the mask pattern is placed in each of the plurality of overlapping images;
  calculating a sum of a value of the first kernels corresponding to the first pixels in each of the plurality of overlapping images; and
  determining the second input parameters by arranging the sum of the value of the first kernels that are calculated for each of the plurality of overlapping images in a predetermined order based on a respective contribution to the plurality of overlapping images by the plurality of first kernels.

18. The etching effect prediction method of claim 17, further comprising:
  using the artificial neural network to generate a prediction of the etch bias of an etching process that uses the mask pattern;
  responsive to the prediction of the etch bias from the artificial neural network, adjusting the mask pattern to form an adjusted mask pattern; and
  forming a semiconductor device using the adjusted mask pattern.

19. An etching effect prediction method, comprising:
  forming a mask pattern on a layer on which an etching process is to be undertaken;
  selecting a target area in which etch bias occurring in the etching process is to be predicted;
  determining input parameters indicating physical characteristics affecting the etching process undertaken in the target area,
  wherein the input parameters comprise:
    first input parameters corresponding to an amount of etching particles in contact with the target area while the etching process is undertaken; and
    second input parameters corresponding to a shape of the mask pattern adjacent to the target area, and
  wherein the determining the input parameters comprises:
    defining a plurality of density measurement areas around the target area, and calculating an area ratio occupied by the mask pattern in each of the plurality of density measurement areas; and
    determining the first input parameters by arranging the area ratio calculated in each of the plurality of density measurement areas in a predetermined order; and
  predicting the etch bias of the target area by inputting the input parameters to input nodes of an artificial neural network as an etching effect prediction model;
  comparing the etch bias that is predicted by the artificial neural network to a measured value of a prior etch bias that occurred in the target area; and
  responsive to a difference in the predicted etch bias and the prior etch bias being equal to or less than a predetermined reference value, adjusting the mask pattern to form an adjusted mask pattern.

20. The etching effect prediction method of claim 19, further comprising forming a semiconductor device using the adjusted mask pattern.

\* \* \* \* \*